US010824777B2

(12) United States Patent
Braghin et al.

(10) Patent No.: US 10,824,777 B2
(45) Date of Patent: **\*Nov. 3, 2020**

(54) EMPLOYING NATURAL LANGUAGE PROCESSING TO FACILITATE GEOSPATIAL ANALYSIS

(71) Applicant: International Business Machines Corporation, Armonk, NY (US)

(72) Inventors: Stefano Braghin, Dublin (IE); Vincent Petrus Anthonius Lonij, Dublin (IE); Rahul Nair, Dublin (IE); Rana E. Novack, Clifton, VA (US); Paulito Pedregosa Palmes, Dublin (IE)

(73) Assignee: INTERNATIONAL BUSINESS MACHINES CORPORATION, Armonk, NY (US)

(\*) Notice: Subject to any disclaimer, the term of this patent is extended or adjusted under 35 U.S.C. 154(b) by 295 days.

This patent is subject to a terminal disclaimer.

(21) Appl. No.: 15/842,672

(22) Filed: Dec. 14, 2017

(65) Prior Publication Data

US 2018/0365354 A1    Dec. 20, 2018

Related U.S. Application Data

(63) Continuation of application No. 15/622,777, filed on Jun. 14, 2017.

(51) Int. Cl.
*G06F 30/20* (2020.01)
*G06F 3/0481* (2013.01)
(Continued)

(52) U.S. Cl.
CPC .......... *G06F 30/20* (2020.01); *G06F 3/0482* (2013.01); *G06F 3/04817* (2013.01); *G06F 40/30* (2020.01); *H04L 67/12* (2013.01)

(58) Field of Classification Search
CPC ....... H04L 43/045; H04L 69/08; G06Q 50/06; G06Q 20/3224; G06Q 10/063118; G06Q 30/0207; G01S 1/026; G01L 15/20
See application file for complete search history.

(56) References Cited

U.S. PATENT DOCUMENTS 7,813,822 B1 \* 10/2010 Hoffberg ............ G06K 9/00369
381/73.1
8,576,666 B1    11/2013 Foley et al.
(Continued)

FOREIGN PATENT DOCUMENTS

WO    2004049125 A3    6/2004

OTHER PUBLICATIONS

List of IBM Patents and Applications Treated as Related.
(Continued)

*Primary Examiner* — Kandasamy Thangavelu
(74) *Attorney, Agent, or Firm* — Amin, Turocy & Watson, LLP

(57) ABSTRACT

Techniques for employing natural language processing (NLP) to facilitate geospatial analysis are provided. In one example, a computer-implemented method comprises receiving, by a device operatively coupled to a processor, input information in a natural language format indicating a change to a state of a system comprising different nodes through which physical elements flow, wherein the system is associated with a state model that characterizes movement of the physical elements through the different nodes based on one or more flow parameters. The computer-implemented method further comprises, determining, by the device based on the input information, a subset of the one or more flow parameters associated with the change, determining, by the device based on the input information, one or more constraints to the subset that account for the change, and
(Continued)

modifying, by the device, the state model based on the one or more constraints, resulting in a modified state model.

9 Claims, 13 Drawing Sheets

(51) Int. Cl.
    *G06F 3/0482*      (2013.01)
    *G06F 40/30*      (2020.01)
    *H04L 29/08*      (2006.01)

(56) References Cited

U.S. PATENT DOCUMENTS

| | | | |
|---|---|---|---|
| 10,018,478 B2 | 7/2018 | Van Os et al. | |
| 2002/0161907 A1* | 10/2002 | Moon | H04L 69/08 709/230 |
| 2006/0112114 A1 | 5/2006 | Yu et al. | |
| 2008/0086363 A1 | 4/2008 | Kass et al. | |
| 2008/0312979 A1* | 12/2008 | Lee | G06Q 10/063118 705/7.28 |
| 2010/0317420 A1* | 12/2010 | Hoffberg | G06Q 30/0207 463/1 |
| 2013/0262055 A1 | 10/2013 | Webber et al. | |
| 2015/0120550 A1* | 4/2015 | Jung | G06Q 20/3224 705/44 |
| 2015/0178853 A1 | 6/2015 | Byron et al. | |
| 2015/0370232 A1* | 12/2015 | Kohn | G06Q 50/06 700/29 |
| 2016/0139242 A1* | 5/2016 | Dupray | G01S 1/026 455/456.1 |
| 2017/0331709 A1* | 11/2017 | Lam | H04L 43/045 |
| 2018/0096696 A1* | 4/2018 | Mixter | G10L 15/20 |

OTHER PUBLICATIONS

Ahmed, et al., "A multi-scale approach to data-driven mass migration analysis," ECML PKDD 2016, 1 page.

Lu, et al., "Predictability of population displacement after the 2010 Haiti earthquake," Proceedings of the National Academy of Sciences of the United States of America 109(29), 2012, 6 pages.

Wilson, et al., "Rapid and Near Real Time Assessments of Population Displacement Using Mobile Phone Data Following Disasters : The 2015 Nepal Earthquake," PLoS Currents (1), Feb. 24, 2016, 25 pages.

ibm.com, "AlchemyLanguage," http://www.alchemyapi.com/products/alchemylanguage/relation-extraction, last accessed: Mar. 7, 2017, 3 pages.

ciprnet.eu, ""What, if . . . " analysis," https://www.ciprnet.eu/whatif.html, last accessed: Mar. 7, 2017, 2 pages.

esri.com, "Disaster Response Program," http://www.esri.com/services/disaster-response, last accessed: Mar. 7, 2017, 3 pages.

esri.com, "Sim Disaster," http://www.esri.com/news/arcuser/0112/sim-disaster.html, last accessed: Mar. 7, 2017, 3 pages.

arenasimulation.com, "Healthcare Emergency Response," https://www.arenasimulation.com/healthcare-emergency-response, last accessed: Mar. 7, 2017, 7 pages.

ibm.com, "Watson Services," http://www.alchemyapi.com/products/alchemylanguage/relation-extraction / https://www.ibm.com/watson/developercloud/services-catalog.html, last accessed: Mar. 16, 2017, 5 pages.

Gavalda, et al., "Proceedings of the First Workshop on Data Science for Social Good," Sep. 19, 2016, 130 pages.

Final Office Action received for U.S. Appl. No. 15/622,777 dated Dec. 11, 2019, 37 pages.

Non-Final Office Action received for U.S. Appl. No. 15/622,777 dated Jul. 11, 2019, 55 pages.

Non-Final Office Action received for U.S. Appl. No. 15/622,777 dated Mar. 26, 2020, 53 pages.

\* cited by examiner

Pseudo code 1: Update flow model parameters consistently

```
def modify_flow_matrix_border_closure(F, i, j):
    F_ii = 1 - sum_(j!=i) F_ij  # we first compute the diagonal element
    F_ij = new_value  # set the new value
    F_ij = F_ij/(sum_j M_ij)  # recompute diagonal
    return F
``` pseudo code 2: update all borders for one country

```
def set border for country(node_index):
    for i in range(flow_matrix.shape[0]):
        if i==node_index:
            new_flow_matrix =modify_flow_matrix_border_closure(new_flow_matrix, i,node_index)
```

FIG. 7

EMPLOYING NATURAL LANGUAGE PROCESSING TO FACILITATE GEOSPATIAL ANALYSIS

BACKGROUND

The subject disclosure relates to employing natural language processing to facilitate geospatial analysis.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatus and/or computer program products that facilitate geospatial analysis using natural language processing (NLP).

According to an embodiment of the present invention, a system can comprise a memory that stores computer executable components and a processor that executes the computer executable components stored in the memory. The computer executable components can comprise a reception component that receives input information indicating a change to a state of a system comprising different nodes through which physical elements flow, wherein the system is associated with a state model that characterizes movement of the physical elements through the different nodes based on one or more flow parameters. The computer executable component can further comprise an input interpretation component that determines, based on the input information, a subset of the one or more flow parameters associated with the change and one or more constraints to the subset that account for the change, and a modeling component that modifies the state model based on the one or more constraints, resulting in a modified state model.

In some embodiments, elements described in connection with the system can be embodied in different forms such as a computer-implemented method, a computer program product, or another form.

DESCRIPTION OF THE DRAWINGS

FIG. 7 provides example pseudocodes that define how to update an example geospatial flow model based on received natural language input in accordance with one or more embodiments of the disclosed subject matter.

DETAILED DESCRIPTION

Figure 1:
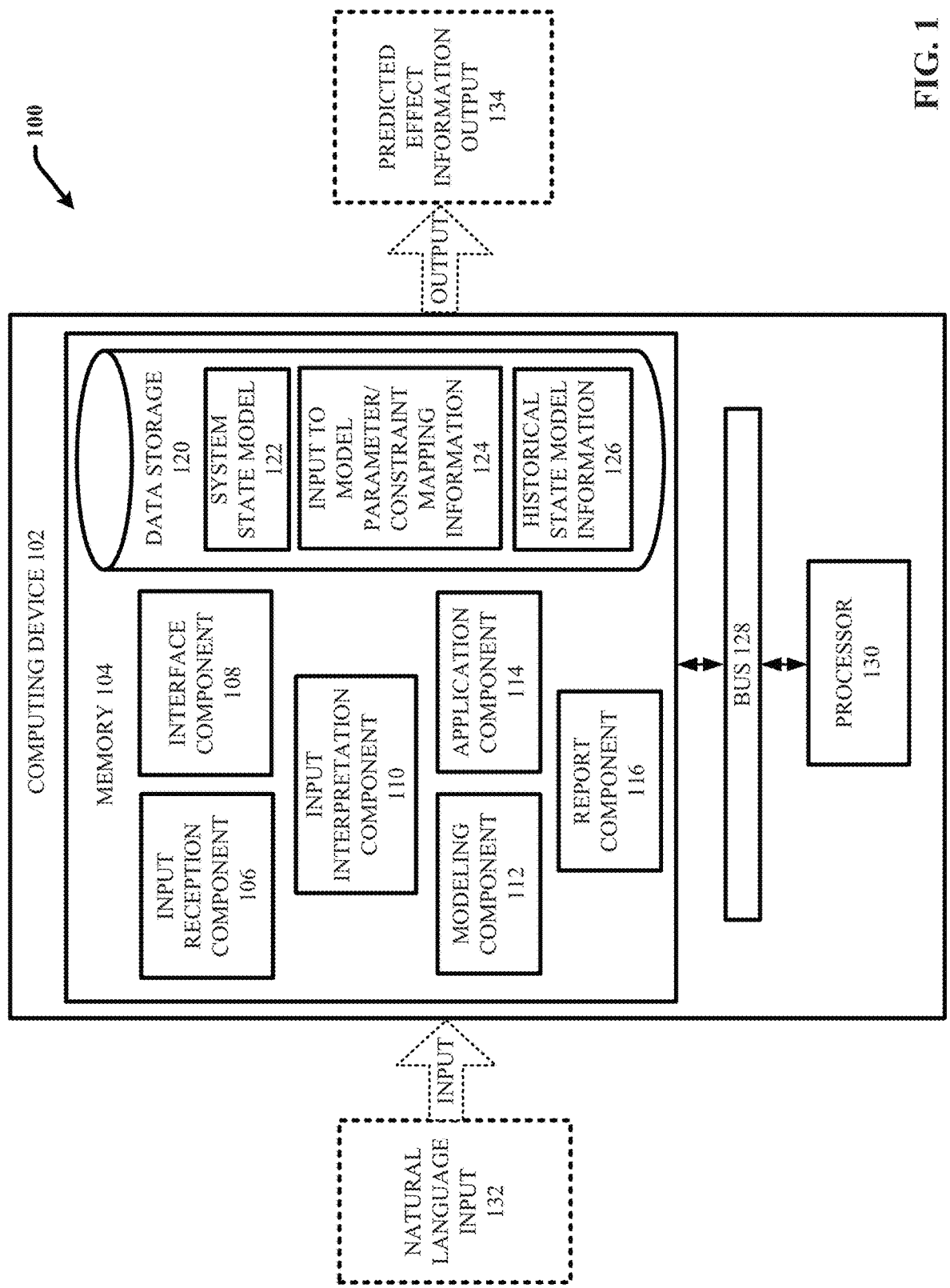
FIG. 1 illustrates a block diagram of an example, non-limiting system that facilitates geospatial analysis using NLP in accordance with one or more embodiments of the disclosed subject matter.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

Various operational and policy decisions require estimates of certain key quantities. For example, in the context of refugee migration, in order to help humanitarian organizations better assist refugees, government agencies need estimates of the outflow and inflow of refugees and migrants from particular countries. For example, to decide how much aid to dispatch to a refugee base, organization needs to know estimates of how many people will be in the base over the next few days, how many people will travel to their country over the next few months, years etc.

Geospatial analysis has been employed to facilitate making such predictions about systems, environments, scenarios, etc., that involve spatial components. Geospatial analysis (also referred to as spatial analysis), is an approach to applying statistical analysis and other analytic techniques to data which has a geographical or spatial aspect. The objective of geospatial analysis is to be able to study and simulate spatial objects or phenomena that occur in the real world and facilitate problem solving and planning. Geospatial analysis covers an umbrella of analytical techniques used to identify patterns in spatial data having a spatial component. In this regard, the spatial data can include but is not limited to, data regarding a static or dynamic event that occurs at a particular location, data regarding an object or entity that is provided at a particular location and data regarding movement of an object or entity relative to a particular location. For example, many real-world activities have a geospatial component, including but not limited to, logistics, global trade, migration, and national security. Furthermore, the same concepts apply at a smaller scale to public/municipal infrastructure components such as electricity networks, telecommunication networks, water networks, road networks and the like. For example, geospatial analysis has been used to evaluate refugee migration, crisis management, climate change modeling, weather monitoring, sales analysis, accident scene analysis, and the like. Simply put, geospatial analysis refers to techniques for understanding real-world systems and events based on where physical components of those systems and events are located at any given time and the relationships between those physical components.

Various geospatial modeling techniques have been designed to discover patterns in spatial data. Some of these geospatial modeling techniques use mathematical models to find associations and patterns (e.g., geospatial association rules) in spatial data based on based on both spatial and non-spatial properties (e.g., time, attributes associated with objects and events at a particular location, etc.). From these patterns, mathematical rules or models can be developed that predict future events or changes associated with the spatial data. Such predictive geospatial analysis is often referred to as geospatial predictive modeling. Geospatial predictive modeling is a process for analyzing events through a geographic filter in order to make statements of likelihood for event occurrence or emergence. Geospatial predictive modeling is conceptually rooted in the principle that the occurrences of events being modeled are limited in distribution. In this regard, there are spatial environment factors (e.g., infrastructure, socio-cultural, topographic, etc.) that constrain and influence what events occur and where the locations of those events occur. Geospatial predictive modeling attempts to describe those constraints and influences using a mathematical model that spatially correlates occurrences of historical geospatial locations with environmental factors that represent those constraints and influences. For example, inductive geospatial predictive modeling relies on empirically calculated spatial relationships between historical or known event occurrence locations and factors that make up the environment (e.g., physical infrastructure, socio-culture, topographic, etc.). Each (or in some embodiments, one or more), event or occurrence can be plotted in geographic space and a quantitative relationship can be defined between the event occurrence and the factors that make up the environment. Those quantitative relationship values are then processed by a statistical function to find spatial patterns that define high and low suitability areas for event occurrence.

The subject disclosure provides computer systems, computer-implemented methods, apparatus and/or computer program products that can automatically perform geospatial predictive modeling to generate predictions about a geospatial system, environment, scenario and the like. In particular, the subject systems, computer-implemented methods, apparatus and/or computer program products can facilitate geospatial analysis of various geospatial systems without requiring any technical knowledge or statistical analytics expertise regarding how to develop, adapt and apply a geospatial model to reflect various assumptions about the state of a geospatial system, (or a geospatial environment, a geospatial scenario, a geospatial phenomenon, etc, collectively referred to herein as a geospatial system). For example, with reference to the refugee migration system, in order to develop and employ geospatial modeling techniques to make various predications about refugee migration, various assumptions about the state of the world should be taken into consideration. For example, these assumptions can include things like, are there border closures or are there particular crises events that might happen. In the humanitarian field (and various other fields that rely on forecasts or predictions about the state of a geospatial system based on various factors), most people don't have the detailed knowledge or experience with mathematical modeling to be able to apply geospatial modeling to make these predictions themselves.

The subject disclosure provides geospatial predictive modeling techniques that provide for automatically updating (e.g., without manual review and modification) a mathematical model of a geospatial system to reflect one or more potential events that may affect the system based on received user input indicating the one or more potential events. In accordance with various embodiments, an initial geospatial predictive model can be developed that models a geospatial system based on a finite set of parameters associated with spatial components of the system. For example, in some implementations, the geospatial model can include a flow model that models the flow or movement of physical elements (e.g., people, commodities, electrical signals, etc.), into, about, and out of, a defined geographical area. This flow can depend on many variables that can change in the model. The average user doesn't have an understanding of what variables to change and how to change them to account for different events. However, with the subject geospatial analysis techniques, an average or non-technical user can provide input that indicates a possible event or scenario that might have an effect on the system. Based on the input, the disclosed geospatial analysis techniques provide for automatically determining how that input relates to an underlying geospatial mathematical model of the system and further automatically adapting the mathematical model to reflect the input.

In particular, the subject geospatial modeling techniques can provide an interface that enables a user to specify scenarios or assumptions about a geospatial system in the form of a human-understandable language, such as a natural language. The natural language input can further be automatically converted to one or more model parameters and associated values for those one or more model parameters. For example, based on received natural language input indicating a possible event or scenario that may have an effect on a geospatial system associated with a defined geospatial predictive model, the disclosed geospatial analysis techniques can extract values/constraints from the input and map these values or constraints to one or more of the model parameters. For instance, the natural language input can include one or more model assumptions (e.g., events, scenarios, etc.) that can be configured from an unstructured representation (e.g., a natural language) to a formal/structured representation (e.g., a machine-readable representation). The structured representation of the model assumptions can then be converted to a set of corresponding model parameters and specific values for the set of model parameters. The model can then be updated to reflect the changes to the model parameters and new predictions about the state of the system can be generated in accordance with the updated model. As a result, the user can be provided with an accurate prediction that reflects their assumption, scenario etc., without having to understand or apply the mathematics behind it. Accordingly, the subject geospatial analysis techniques can allow a user to make natural language queries like "Estimate what happens in a power network if a substation fails?", or "How might a natural disaster or political/social unrest influence a refugee crises or migration event?", and analyze the consequences without the need to know the details of the underlying geospatial predictive models. Based on these predictions, the system (or a human) can automatically determine and initiate appropriate responses, such as dispatching additional materials or personnel to a set of locations based on projected need.

In this disclosure, the refugee migration system is used as an example use-case in association with various embodiments of the disclosed predictive geospatial modeling techniques. However, it should be appreciated that the disclosed geospatial modeling techniques can be applied to several other fields or applications with geo-spatial components, including but not limited to: global logistics, aviation, power networks, water networks, transportation (of goods and people), and other public/municipal infrastructures. For example, the subject geospatial analysis techniques can be applied to any system that has a finite set of spatial parameters that can be modeled mathematically, such as a flow of goods or people about a geographical area, a flow of electrons through a power grid, and the like.

Turning now to the drawings, FIG. 1 illustrates a block diagram of an example, non-limiting system 100 that facilitates geospatial analysis using NLP in accordance with one or more embodiments of the disclosed subject matter. Aspects of systems, apparatuses or processes explained in this disclosure can constitute machine-executable components embodied within machine(s), e.g., embodied in one or more computer readable mediums (or media) associated with one or more machines. Such components, when executed by the one or more machines, e.g., computer(s), computing device(s), virtual machine(s), etc. can cause the machine(s) to perform the operations described.

System 100 and/or the components of the system 100 can be employed to use hardware and/or software to solve problems that are highly technical in nature, that are not abstract, and that cannot be performed as a set of mental acts by a human, e.g., analyzing various forms of natural language input describing an event or scenario associated with a geospatial system, automatically converting the natural language input into a structured, machine-readable format, and further automatically correlating the structured machine readable format of the natural language input to one or more parameters, and/or values for those one or more parameters, of a geospatial predictive model. System 100 can further automatically update the geospatial predictive model to reflect the event or scenario based on the correlated model parameters and/or values and apply the updated model to historical data evaluated by the model to generate output information indicating a predicted effect of the event or scenario on the geospatial system. Further, some of the processes performed can be performed by specialized computers for carrying out defined tasks related to geospatial analysis. System 100 and/or components of system 100 or other systems described herein can be employed to solve new problems that arise through advancements in technology, computer networks, the Internet, and the like. The system 100 can provide technical improvements to geospatial analysis in general, and more specifically allows users to efficiently and automatically receive accurate predictions about various user proposed changes to a geospatial system without having to perform any manual geospatial predictive modeling.

System 100 includes a computing device 102 that can comprise a processor 130 and a memory 104 that stores executable instructions or components that, when executed by the processor 130, facilitate performance of operations that include geospatial analysis using NLP. In the embodiment shown, these executable components include an input reception component 106, an interface component 108, an input interpretation component 110, a modeling component 112, an application component 114, and a report component 116. These executable components can be electrically and/or communicatively coupled to one another to perform the functions of the various geospatial analysis functions of the computing device 102. The memory 104 can also include data storage 120 that can store variety of information employed by the computer executable components to perform geospatial analysis using NLP. For example, in the embodiment shown, the information can include a system state model 122, input to model parameter/constraint mapping information 124 and historical state model information 126. In other embodiments, the information included in the data storage 120 and other information that can facilitate geospatial analysis using NLP by the computer executable components can be stored at one or more external data sources that are accessible to the computing device 102 (e.g., via a network). The computing device 102 can also include a device bus 128 to communicatively connect the various components of the computing device 102, including the memory 104 and its associated components, and the processor 130. Additional features and functionalities of said processor 130 and memory 104, as well as other suitable computer or computing-based elements, can be found with reference to FIG. 12, and can be used in connection with implementing one or more of the systems or components shown and described in connection with FIG. 1 or other figures disclosed herein.

System 100 and and/or the components of the system 100 can automatically perform geospatial predictive modeling to generate predictions about a geospatial system, environment, scenario and the like. In particular, system 100 can provide for automatically updating (e.g., without manual review and modification) a mathematical model of a geospatial system (or environment, scenario, etc.) to reflect one or more potential events that may affect the system based on received user input indicating the one or more potential events. The geospatial system, environment, scenario, etc. can include any type of system, environment, scenario, etc., that involves a finite set of spatial factors (e.g., physical infrastructure, socio-cultural, topographic, etc.) that constrain and influence what events occur and the locations where those events occur. For example, the geospatial system, environment, scenario, etc., can include but is not limited to: a logistics scenario, a global trade scenario, a migration scenario, a national security scenario, an electricity system, a telecommunication system, a water system, a road system, climate system, and the like. For a given geospatial system, environment, scenario, etc., an initial mathematical model can be employed that correlates geospatial locations with respective parameters of a finite set of model parameters (e.g., infrastructure, socio-cultural, topographic, etc.) and/or values for those model parameters that represents constraints and influences over what events occur in the system, environment, scenario, etc., and the locations where those events occur. This mathematical model can be built using various historical data sources that include known or historical spatial data for the system, environment, scenario, etc., (or a similar system, environment, scenario, etc.). For example, depending on the particular geospatial system, (environment, phenomena, etc.), being evaluated, a geospatial predictive model can be developed for the geospatial system using a variety of available data sources, including but not limited to: geographic information systems, governmental databases, social media systems, news systems, and the like. This geospatial predictive model can include a mathematical model that models one or more patterns and/or relationships associated with one or more elements of a system, environment, scenario, etc., based on know parameters associated with defined physical locations of the system, environment, scenario, etc. This mathematical model can be generated by the computing device 102 or another computing system/device and stored in the data storage 120 of the memory 104 or at an external system/ source that is accessible to the computing device 102 (e.g., via a network). In the embodiment shown, this initial mathematical model is stored in the data storage 120 as system state model 122.

For example, in one or more embodiments, the mathematical model can include a flow model that predicts the movement of physical elements/objects (e.g., people, goods, commodities, electrical signals, etc.), into, out of, and/or throughout a defined physical area based on one or more defined model parameters that can influence the movement. In this flow model context, the model parameters that have an influence on the movement are referred to as flow parameters. For instance, in one example, implementation, the physical area can include a geographical area and the physical elements can include people. In this regard, the mathematical model can be used to model and predict the inflow and outflow of people (e.g., immigrants, refugees, etc.) relative to the geographic area and the movement of people between different locations within the defined geographic area. This flow model can be generated based on various humanitarian data sources, such mass migration data generated from news articles, social media, registration counts and the like.

Figure 2:
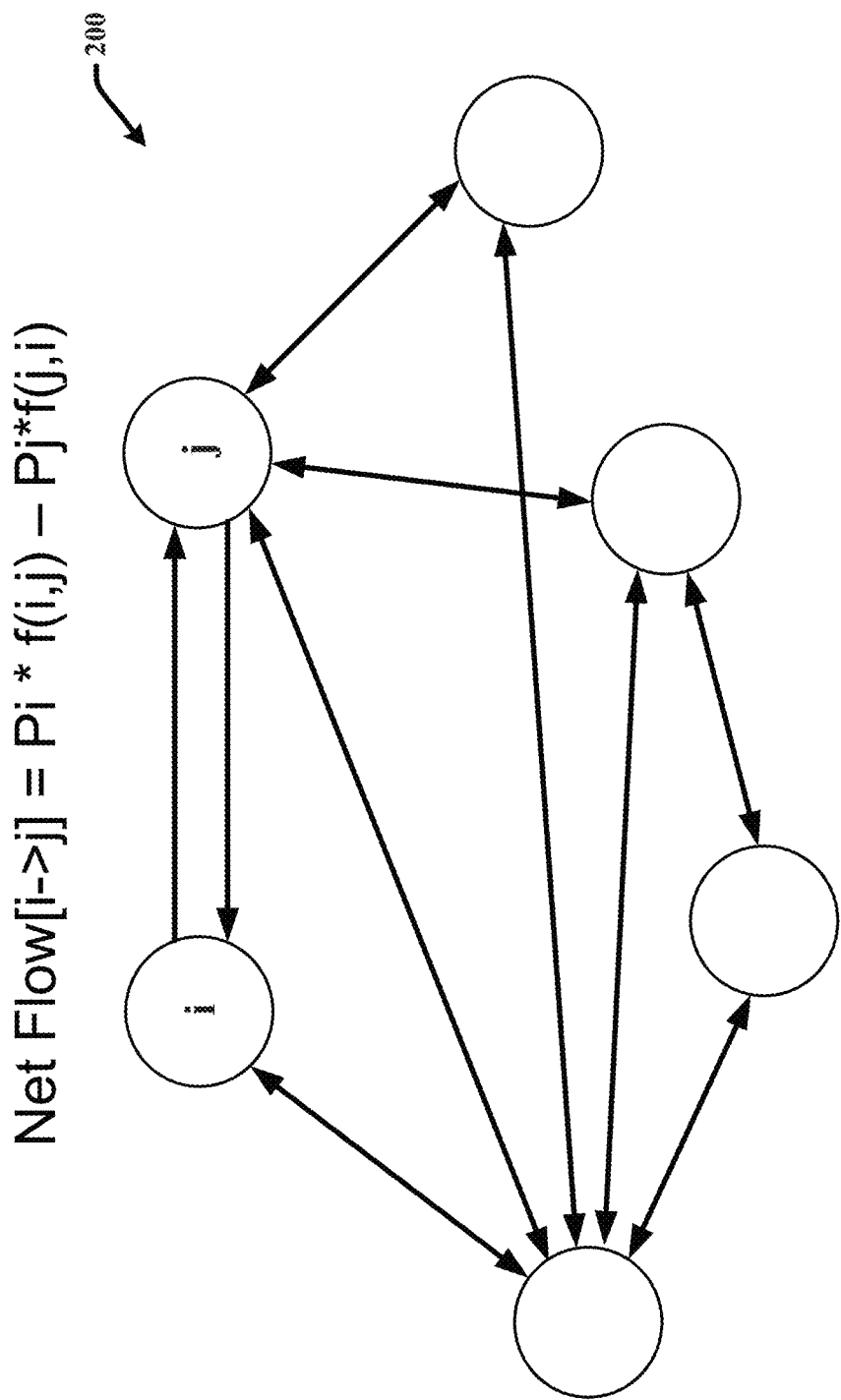
FIG. 2 presents a high level diagram of an example geospatial flow model in accordance with one or more embodiments described herein.

For example, FIG. 2 presents a high level diagram of an example flow model 200 in accordance with one or more embodiments described herein. In one or more embodiments, the flow model 200 can be or include system state model 122, or vice versa. The flow model 200 represents a system or network comprising different nodes through which physical elements flow. The respective circles can correspond do the different nodes which can respectively correspond to different locations. For example, the different locations can be different geographical locations, different virtual locations (e.g., in implementations in which the system represents different virtual machines), and the like. In one or more embodiments, flow model 200 can characterize the movement of the physical elements through the different nodes based on one or more flow parameters. For example, the physical elements can include people, goods/ commodities, data signals, electrons, etc. Each of the arrows can correspond to edges and indicate travel paths that provide for moving from one node/location to another. In accordance with one or more geospatial modeling techniques, the ability for an object to move from one location to another can be represented by a number. For example, in accordance with flow model 200, the ability to move between the six nodes can be defined mathematically by a 6×6 matrix. Each (or in some embodiments, one or more), matrix entry can correspond to a parameter that represents tan ability to move between two nodes. The key is to set the values for these parameters to accurately reflect the state of the system. For example, at the matrix coordinate square corresponding to (i) and (j), if this set to 0 that can means that no movement can occur between (i) and (j).

Figure 3:
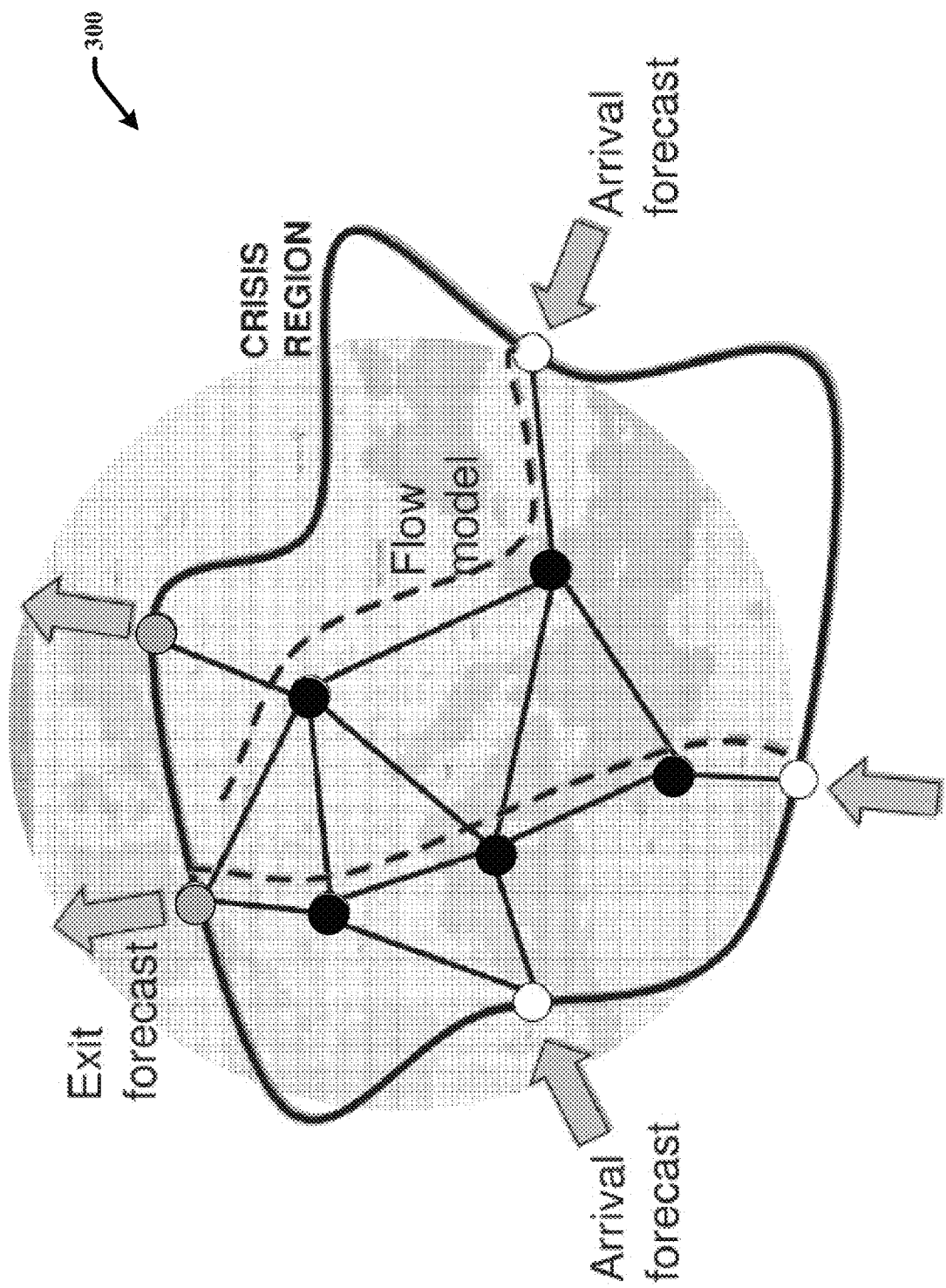
FIG. 3 presents another example geospatial flow model in accordance with one or more embodiments of the disclosed subject matter.

FIG. 3 presents another example flow model 300 in accordance with one or more embodiments of the disclosed subject matter. In one or more embodiments, the flow model 300 can be or include system state model 122, or vice versa. Flow model 300 provides an embodiment of flow model 200 as applied to a refugee migration flow analysis in association with a crisis region of interest where dynamics of refugee migration can be evaluated. Similar to flow model 200, flow model 300 can include a plurality of nodes represented by circles. In accordance with flow model 300, each (or in some embodiments, one or more), of the nodes corresponds to different geographical locations included in a defined crisis region. Each (or in some embodiments, one or more), of the white circles represents entry nodes or locations where refugees enter the crisis region. Each (or in some embodiments, one or more), of the grey circles represent exit nodes or locations where refugees exit the crisis region, and each (or in some embodiments, one or more), of the black circles represent transition nodes or locations within the crisis region between which the refugees can move.

In one implementation, flow model 300 can represent a European crisis region that includes the regions around the Mediterranean Sea where paths of flight are concentrated. The crisis region of interest should include potential transit paths that may be considered by migrants (e.g., represented by the dashed lines). The region could also include sources of forced displacement or intended destinations, (e.g. Syria or Germany respectively). The main crisis region can be modeled by a network flow model, such as flow model 300, which models the rate of movement from one node to another. In some implementation, the boundary conditions (e.g., amount and rate of refugees entering the crisis region and exiting the crisis region) can be handled by additional models, such as an arrivals model and an exit model. For example, an arrivals model is a time series forecasting model that predicts daily arrival rates at nodes on the edge of the crisis region. To determine exit rates and consider intended destinations, a macro push-pull model can be used to estimate fraction of migrants for each likely destination.

In accordance with various exemplary embodiments, the subject geospatial analysis techniques can be described in association with a network flow model, such as flow models 200 and 300 described above. In this regard the network can be defined by a set of nodes (e.g., locations) and a set of edges (e.g., the ability of people/objects to move from one node to another). The number of people/objects at each (or in some embodiments, one or more), node can be encoded in a state vector. The propensity of people/object to travel from one node to another can be encoded in a matrix (F). The elements of this matrix can be interpreted as split-fractions. In this regard, during each (or in some embodiments, one or more), time interval the fraction of people/ object present in node A that will travel from node A to node B is given by F(A,B). Entry into the spatial region (e.g., the crisis region) can be modeled using a variety of statistical modeling approaches.

With reference again to FIG. 1, in various embodiments, the input reception component 106 can be configured to receive natural language input regarding a possible event associated with a geospatial system modeled by the system state model 122. Such input is referred to hereafter as the natural language input 132. For example, the subject systems, computer-implemented methods, apparatus and/or computer program products can be configured to receive user input describing, identifying or otherwise indicating one or more events that may have an effect on a particular system associated with a geospatial predictive model. This input can be provided by a user in a natural language and then interpreted by the computing device 102 via the input interpretation component 110 using natural language processing (NLP). Based on reception (e.g., via the input reception component 106) of natural language input 132 indicating one or more potential events that may have an effect on a geospatial system (environment, scenario, etc.), the input interpretation component 110 can predict how the one or more potential events can affect the system by determining how the one or more potential events affect the corresponding system state model 122. In this regard, the input interpretation component 110 can be configured to automatically correlate the natural language input 132 regarding the event into one or more defined parameters of the mathematical model and/or specific values for the one or more defined parameters.

Using predictive geospatial modeling, the modeling component 112 can then adapt the system state model 122 to reflect the one or more potential events by changing the particular model parameters affected by the one or more events to reflect the one or more events and/or the manner in which the parameters are affected. In particular, the modeling component 112 can then update the system state model 122 to reflect the changes to the one or more defined parameters and/or their associated values. Once these parameters (or values for these parameters) are changed, the application component 114 can apply the updated state model to determine output information regarding one or more predicted effects on the geospatial system resulting from the one or more proposed events. Such output information is referred to hereafter as predicted effect information output 134. For example, with respect to a data flow model that models the flow of physical elements into, throughout and/or out off a system, the potential event evaluated can include closure of a particular entry point to the system. According to this example, the modeling component 112 can update the mathematical model to reflect closure of this entry point. The application component 114 can further apply the updated mathematical model to the historical state model information 126 processed by the system state model 122 to determine the predicted effect information output 134 regarding the manner in which the physical elements flow into, through and out of the system changes based on the closure. The report component 116 can further report the predicted effect information output 134 by generating a report, notification, or the like that can be rendered at a user device (e.g., via a GUI, via an audible notification, or the like).

In accordance with the subject disclosure, a natural language can include any language that has evolved naturally in humans through use and repetition without conscious planning or premeditation. Natural languages can take different forms, such as speech, signing, writing, drawing, dancing, etc. They are distinguished from constructed or structured and formal languages such as those used to program computers or to study logic (e.g., computer programming languages and international auxiliary languages). In accordance with the subject disclosure, a natural language does not include a computer programming language, computer programming code, or pseudocode.

The natural language input 132 can vary based on the particular geospatial system, environment, scenario, etc., that system state model 122 is based. In various embodiments, the natural language input 132 can include a free form sentence, question, or phrase consisting of natural language words and syntax. According to these embodiments, the natural language input can be provided by a user by typing (e.g., in plain text), speaking (e.g., which can be converted to plain text using voice recognition), signing, gesturing, or otherwise conveying the free form sentence, question, or phrase to the computing device 102 using a suitable input device (e.g., a keypad, a keyboard, a touchscreen, a voice recognition system, a gesture recognition system, etc.). For example, in one or more embodiments, the interface component 108 can generate and/or provide a front end GUI that allows a user to provide natural language input in association with a selected geospatial system that describes, indicates or otherwise conveys an event or scenario that could have an impact on the geospatial system. For example, the GUI can include a text box or query bar that can receive natural language text input in association with the selected geospatial system. For example, in an implementation in which the geospatial system involves refugee migration associated with a defined geographic area, the geospatial system can be associated with a system state model 122 that includes a flow model that models the movement of refugees into the geographical area, out of the geographical area, and between different cities or locations within the geographic area. According to this example, if the geographic area includes the countries Greece and Macedonia, the natural language input could include free form plain text user input including a question asking "what would happen if the border between Greece and Macedonia was closed tomorrow?" The GUI can also provide an output (e.g., via report component 116) in the form of a visual (e.g., as text, imagery, etc.) and/or audible response describing the system's reaction to the event or scenario based on the processed input.

In other embodiments, in addition to or in the alternative to the free form plain text natural language input, the natural language input can include user selection of one or more different defined scenario from a predefined set of scenarios. For example, in furtherance to the above noted refugee migration scenario, the interface component 108 can provide a user with options, selectable from a GUI that allows the user to select from one or more defined locations and one or more defined actions or events associated with the one or more defined locations. The selected locations and/or events can be converted into a defined scenario that can be converted by the input interpretation component 110 to one or more defined model parameters and constrains/values for those parameters.

Still in other embodiments, in addition to or in the alternative to the free form plain text natural language input, the natural language input 132 can include user interaction with one or more images, icons, hyperlinks, selectable text, or the like displayed on a GUI, wherein the user interaction conveys a particular event or scenario associated with a system, environment, scenario, etc., represented by a geospatial predictive model. For example, in accordance with the refugee migration system, the computing device 102 can provide an interactive map (e.g., via interface component 118) that allows users to provide natural language input by selecting different locations on the map and select different actions or events relative to those locations to indicate a possible event that could change the state of the system. Thus the input reception component 106 can be configured to receive natural language input 132 in a format that is clearly and naturally understood by humans that provides some indication of an event or scenario that could have an effect on particular geospatial system the system 100 is configured to evaluate. This input can be a natural language question provided using plain text input, gesture input, input involving interaction with a drawing or map, or the like.

Figure 4:
FIG. 4 provides an example graphical user interface (GUI) that facilitates geospatial analysis using NLP in accordance with one or more embodiment described herein.

For example, FIG. 4 provides an example GUI 400 that facilitates geospatial analysis using NLP in accordance with one or more embodiment described herein. In the embodiment shown, the GUI can be configured to facilitate receiving natural language input in association with receiving predictions about a geospatial flow model that evaluates the flow objects (e.g., people, goods, etc.) between different geographic locations. In this regard, the input can be considered natural language because the user interactions with the map components can be cognitive in the sense that they are human understandable with respect to the particular events or scenarios the interactions represent.

In the embodiment shown, the GUI 400 provides an interactive map including various defined locations (represented by the dots or circles) and travel paths between the different defined locations, (represented by the lines). In one example embodiment, the map can facilitate receiving a define set of natural language inputs that correspond to possible events that could impact the flow based on selecting one or more locations and/or lines. For example, in the embodiment shown, a free from circle 402 has been drawn around a subset of the locations. In one embodiment, a user can provide input selecting the subset of locations by drawing the circle around these locations. This input can be correlated to a defined action (e.g., removal from the flow) and/or the user can provide additional input describing an action collectively associated with the circled locations (e.g., provision of additional resources to these locations). In another example, the GUI can allow the user to select certain lines or paths between locations and apply an action (e.g., deletion of the line), to indicate a particular event (e.g., path closed).

Figure 5:
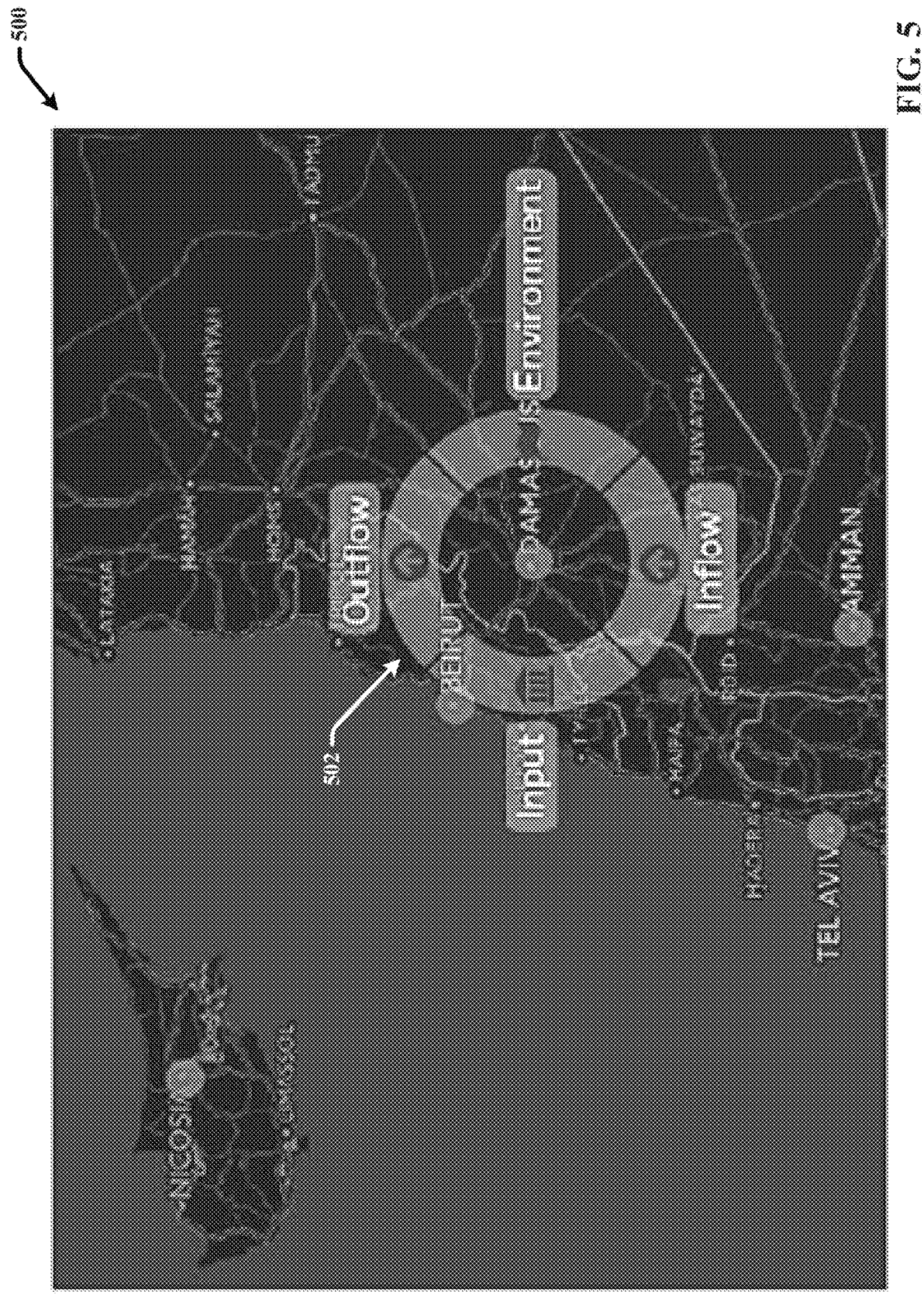
FIG. 5 provides another example GUI that facilitates geospatial analysis using NLP in accordance with one or more embodiments described herein.

FIG. 5 provides another example GUI 500 that facilitates geospatial analysis using NLP in accordance with one or more embodiment described herein. In the embodiment shown, the GUI 500 can also be configured to facilitate receiving natural language input in association with receiving predictions about a geospatial flow model that evaluates the flow objects (e.g., people, goods, etc.) between different geographic locations. Again, the input can be considered natural language because the user interactions with the map components can be cognitive in the sense that they are human understandable with respect to the particular events or scenarios the interactions represent. According to this embodiment, the GUI can include a scenario defining widget 502 that can provide for various natural language inputs for a set of defined user friendly options. For example, in some implementations, the scenario defining widget 502 can allow the user to select from a defined set/combination of scenarios. For example, the user can provide natural language input that limits or increases the inflow by clicking on the inflow button and changing the inflow amount accordingly. In another example, the user can provide natural language input that limits or increases the outflow by clicking on the outflow button and changing the inflow amount accordingly. Likewise, the user can provide natural language input that manually sets the number of arrivals by clicking on the arrivals button. The user can also select the environment button to select a particular environmental event that might happen. In other implementations, the scenario defining widget 502 can be moved around to various defined locations on the map. Once associated with a particular location, using the scenario defining widget 502, a user can provide additional input selecting one or more parameters and/or changes to these parameters that can influence the flow. For example, the user can select parameter categories such as outflow button, the inflow button, the input button, the environment button, and the like and provide input that can affect these parameter categories. For instance, a user can select the parameter environment and further chose a constraint such a weather condition, a resource condition, a combat condition, etc. In accordance with this example implementations, the specific parameter options available and associated input can be predefined to a finite set of parameter combinations and constrain/values.

It should be appreciated that front end/back end architecture of system 100 can vary. For example, in some implementations, front end and back end processing components and hardware components can be provided on a single computing device (e.g., computing device 102). According to these implementation, the computing device 102 can include suitable input and output hardware and/or software to receive natural language input 132 (e.g., a keypad, a keyboard, a touchscreen, a speech recognition device, a gesture recognition device, etc), convey the natural language input 132 to the various processing components (e.g., input reception component 106, interface component 108, input interpretation component 110, modeling component 112, application component 114, and report component 116), and render a result of the processed input at the computing device 102 (e.g., via a display, speaker, etc.). In other implementations, the front end and back end processing components and hardware components can be distributed between two or more devices in a distributed computing architecture. According to these implementations, the respective front end and back end components can be communicatively coupled via one or more wired and/or networks (e.g., the Internet, an Intranet, a wireless area network (WAN), a cellular network, a local area network (LAN), a wireless fidelity network, and the like. For example, in some implementations, the interface component 108 can be provided at a client device (not shown) and the various additional NLP components of the computing device 102 can be provided at a server device that is accessed by the client device (e.g., not shown) via a network (e.g., the Internet). According to these implementations, the various NLP functions described herein can be embodied in a web-application, a cloud-application, a thin client application, a thick client application, a native client application, a hybrid client application, or the like.

With reference back to FIG. 1, in one or more embodiments, the input interpretation component 110 can be configured to interpret the natural language input 132 by processing the natural language input 132 using one or more NLP functions to identify one or more parameters of the system state model 122 that are associated with the particular event or scenario represented by the natural language input. In this regard, the natural language input can indicate, based on the event or scenario, some type of change to the state of the geospatial system represented by the system state model 122 and the input interpretation component 110 can determine a subset (including one or more) of the model parameters associated with the change. The input interpretation component 110 can further determine, based on the natural language input, one or more constraints to the one or more parameters that are implied by the event or scenario. In this regard, the one or more constraints can reflect the change to the state of the system and correspond to specific values for the one or more parameters. For example, in furtherance to the above example, based on reception of natural language input asking "What would happen if the border between Greece and Macedonia was closed tomorrow?", the input interpretation component 110 can determine that the flow model parameters associated with movement between Greece and Macedonia are implied by the proposed scenario. The input interpretation component 110 can further determine that a constraint associated with these parameters involves a closer of the path between these two locations. Thus the input interpretation component 110 can further determine the specific value to associate with the parameter corresponding to the path between Greece and Macedonia to indicate that the path is closed (e.g., a value change from zero to one for this corresponding parameter).

In some embodiments, the input interpretation component 110 can employ a NLP technique that involves an initial conversion of the natural language input 132 into a structured, machine-readable format (e.g., a programming language) that defines the event. The input interpretation component can further correlate the structured, machine-readable representation of the natural language input to one or more defined model parameters and specific values/constrains for the one or more defined model parameters. The modeling component 112 can then update the one or more defined model parameters of the system state model 122 to reflect the specific values/constraints. The application component 114 can further apply the updated state model to the historical state model information 126 to evaluate any changes to the system caused by the proposed event, and the report component 116 can further provide the user with predicted effect information output 134 (e.g., in the form of a report, a chart, a notification etc.), that indicates the changes to the system as a result of the proposed event. For instance, in furtherance to the above refugee migration system example, based on reception of natural language input asking what would happen if the border between Greece and Macedonia was closed tomorrow, the application component 114 can evaluate one or more changes the refugee migration system flow as a result of the closure (as modeled by the updated flow model). For example, the application component 114 can determine that based on the updated flow model, that refugees from Greece would likely begin moving into Macedonia by way of Albania, resulting in an increased influx of X refugees in Albania the next few days (where X is an integer). This information can be provided to the user by the report component 116 in the form of a report, notification, or the like.

Figure 6A:
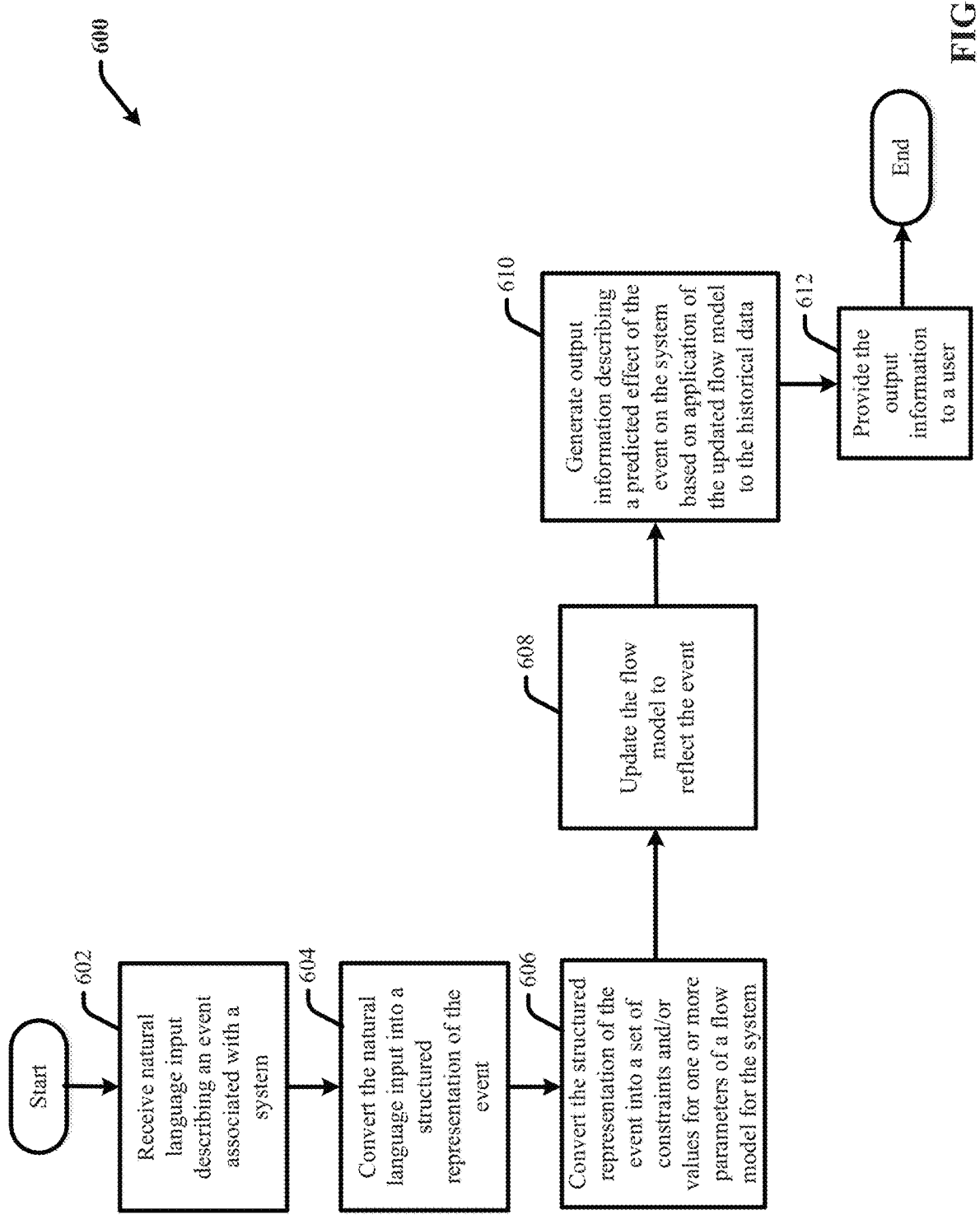
FIGS. 6A-6B provide high level flow diagrams of example, non-limiting computer implemented methods for employing NLP to facilitate geospatial analysis in accordance with one or more embodiments described herein.

For example, FIG. 6A provides a high level flow diagram of an example, non-limiting computer implemented method 600 for employing NLP to facilitate geospatial analysis in accordance with one or more embodiments described herein. In various embodiments, method 600 can be performed by computing device 102 and/or one or more components of computing device 102 (e.g., the input reception component 106, the interface component 108, the input interpretation component 110, the modeling component 112, and/or the application component 114). Repetitive description of like elements employed in respective embodiments is omitted for sake of brevity.

At 602, the computing device 102 can receive (e.g., via input reception component 106) natural language input describing an event associated with a system. For example, in one implementation, the system can include a refugee migration network modeled by a geospatial flow model that models the movement of refugees into, out of and through different locations within a crisis region based on various patterns in historical data. According to this example, the computing device 102 can receive natural language input indicating a scenario that involves closure of a border between Greece and Macedonia. For example, the natural language input can be in the form of a question, phrase, sentence, etc., provided in plain text, speech converted to plain text, signing/gestures converted to plain text, user interface interaction converted to plain text, or the like. In another example, the input can include user interaction with an interactive GUI that provides for selecting or creating defined scenarios that can be evaluated by the computing device by automatically updating the flow model.

At 604, the computing device 102 can initially convert the natural language input into a structured representation of the event (e.g., using the input interpretation component 110). This can include determining defined elements of the event based on the natural language input. For example, based on input indicating a scenario that involves closure of a border between Greece and Macedonia, at 604, the computing device can determine an event subject (e.g., border closure), an event location (e.g., Greece and Macedonia), and the like. This structure can have one or more predefined elements or structure categories (e.g., event subject, event category, etc.) which can vary depending on the particular geospatial system being evaluated, the underlying geospatial predictive model designed for the system, and the particular scenario or event proposed. In various implementations, the input interpretation component 110 can be configured to employ key word detection in the natural language input to determine which elements are involved and the respective structured terms or computer readable code to define the corresponding elements. At 606, the computing device 102 can be configured to take this structured representation and turn it into model constraints and/or values for the one or more parameters of the mathematical flow model for the system (e.g., using the input interpretation component 110). In particular, the computing device 102 can convert the structured representation of the natural language input into a (finite) list of parameter updates to the model. Then at 608, the computing device can update the flow model to reflect the event. At 610, the computing device 102 can then generate output information describing a predicted effect on the system (e.g., predicted effect information output 134) based on application of the updated flow model to the historical data (e.g., using application component 114). Then at 612, the computing device can provide the output information to a user (e.g., via report component 116). For example, the computing device can render the output information via a display of the computing device 102 or provide the output information to another device for rendering via a display.

Figure 6B:
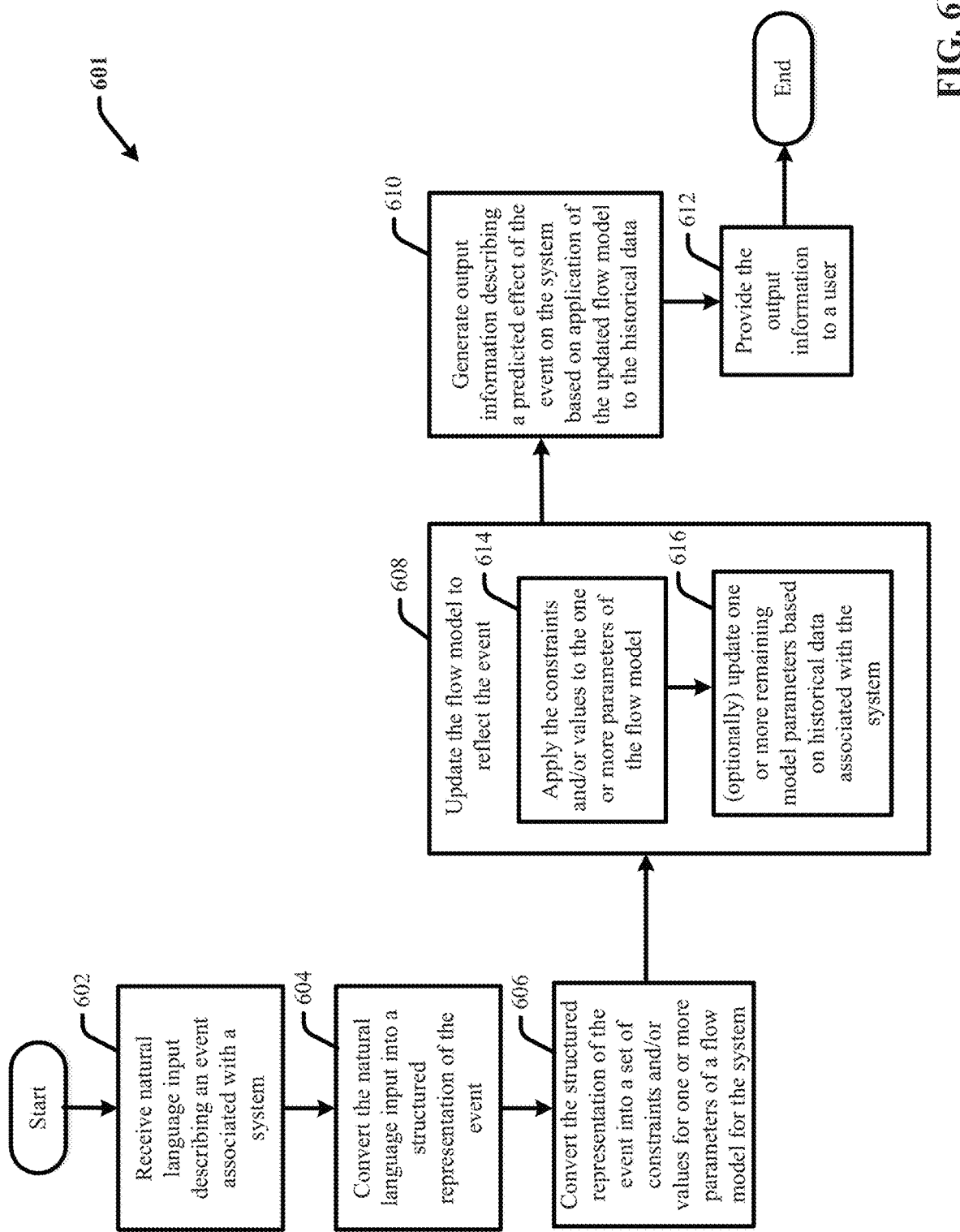

For example, FIG. 6B provides a high level flow diagram of another example, non-limiting computer implemented method 601 for employing NLP to facilitate geospatial analysis in accordance with one or more embodiments described herein. In various embodiments, method 600 can be performed by computing device 102 and/or one or more components of computing device 102 (e.g., the input reception component 106, the interface component 108, the input interpretation component 110, the modeling component 112, and/or the application component 114). Method 601 includes same or similar features and functionalities as method 600 with the addition of procedures 614 and 616 in association with updating the flow model to reflect the event at 608. Repetitive description of like elements employed in respective embodiments is omitted for sake of brevity.

In one or more embodiments, the computing device 102 can update the flow model to reflect the event at 608 by applying the constraints and/or values to the one or more model parameters of the flow model at 614 (e.g., via modeling component 112). Optionally, the computing device (e.g., via modeling component 112) can also update one or more remaining model parameters based on historical data associated with system and the updates to the one or more parameters directly updated/affected by the event. For example, in some implementations, the application of the constraints and/or values to the one or more parameters of the flow model at 610 can include correlating the constraints and/or values to computer programming code or psuedocode that define how to mathematically update the flow model. The computing device 102 can then update the flow model by executing the corresponding code or psuedocode (e.g., via modeling component 112). For example, in accordance with the subject refuge migration flow model, if a border and defined path is closed, then the entire system flows have to redistribute among the available paths. For example, updated the model must ensure that people cannot appearing out of thin air, people cannot leave from a location where there are no people, and the like. The modeling component 112 can thus identifying and apply the correct code/pseudocode that when executed, are configured to update the flow model such that all the appropriate parameters are adapted and updated accordingly to account for changes to a subset of the parameters.

For example, FIG. 7 provides example pseudocodes 1 and 2 that define how to update an example geospatial flow model based on received natural language input in accordance with one or more embodiments of the disclosed subject matter. In particular, pseudocodes 1 and 2 provide example codes that can be executed by the computing device 102 in association with updating a flow model that models refugee migration associated with various European countries included in a defined crisis region in response to natural language input indicating a border closure between Greece and Macedonia. In accordance with this example, the flow model can be defined by a set of nodes (e.g., locations) and a set of edges (e.g., the ability of people/objects to move from one node to another). The number of people/objects at each (or in some embodiments, one or more) node can be encoded in a state vector. The propensity of people/object to travel from one node to another can be encoded in a matrix (F). The elements of this matrix can be interpreted as split-fractions. In this regard, during each, (or in some embodiments, one or more), time interval, the fraction of people/object present in node A that will travel from node A to node B is given by $F(A,B)$. Entry into the spatial region (e.g., the crisis region) can be modeled using a variety of statistical modeling approaches.

For example, with respect to scenario specifying a border between Greece and Macedonia will be closed, the modeling component 112 can update the flow model by adjusting the elements of matrix (F) in a non-trivial way (e.g., by setting all inflows to 0: $F(i,B)=0$ for all i and B=Macedonia, while maintaining the outflows as: $Sum\_j\ F(i,j)==1$). This can be accomplished as follows: if a border is closed (e.g., a specific edge weight can set to 0), the modeling component can be configured to apply pseudocode 1 to update the flow modal parameters consistently. The modeling component 112 can further apply pseudocode 2 to update all borders for one country.

With reference again to FIG. 1, in one or more embodiments, the input interpretation component 110 can be configured to interpret the natural language input 132 using a NLP function that maps one or more key terms, words, gestures, and/or user GUI interactions to defined model parameters, respective constraints for the defined model parameters, and respective values for the model parameters that correspond to the respective constraints. For example, in implementations in which the geospatial system includes a geographical region associated with a network flow model and the natural language input 132 includes plain text and/or can be converted to plaint text (e.g., from speech, gesture, signing, user GUI interactions, or the like), the input interpretation component 110 can be configured to detect geographical entities, such as countries and borders and detect operations such as 'open' and 'close,' based on key terms or words include in the plain text. According to this implementation, the input interpretation component 110 can operate as a relationship extraction engine that can identify topic-specific key-words that map sentence entities onto known model parameters and operations (e.g., using a word2vec modeling or the like).

According to these embodiments, the input interpretation component 110 can access input to model parameter/constraint mapping information 124 stored in data storage 120 (or at remote memory accessible to the input interpretation component 110) that maps various possible natural language input key terms, words, gestures, and/or user GUI interactions with the defined model parameters, respective constraints for the defined model parameters, and respective values for the defined model parameters that correspond to the respective constraints. For example, the system state model 122 can include a defined set of model parameters and the input interpretation component 110 can map specifically identified key terms/words, gestures, user GUI interactions etc., with a subset of the defined model parameters. Further, each of the model parameters (or in some embodiments, one or more), can be associated with a defined set of constraints (which can be two or more values). Thus in various implementations, the input interpretation component 110 can select the one or more constraints from a defined set of constraints associated with the one or more parameters represented by the natural language input.

Figure 8:
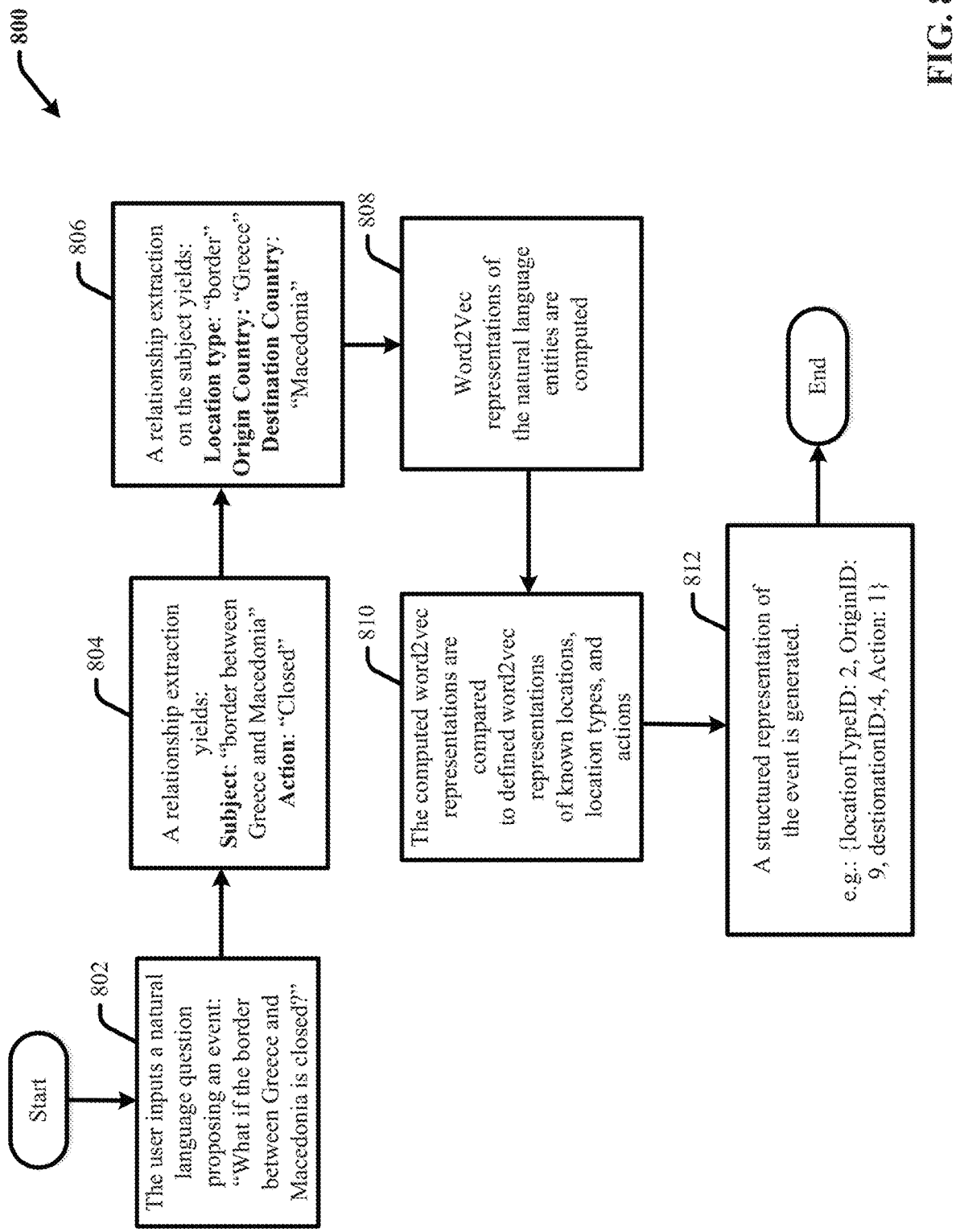
FIG. 8 provides a high level flow diagram of another example, non-limiting computer implemented method for employing NLP to facilitate geospatial analysis in accordance with one or more embodiments described herein.

For example, FIG. 8 provides a high level flow diagram of another example, non-limiting computer implemented method 800 for employing NLP to facilitate geospatial analysis in accordance with one or more embodiments described herein. Method 800 particularly exemplifies some of the features and functionalities of system 100 as applied to facilitate making predictions about possible scenarios impacting a refugee migration network modeled by a geospatial flow model. In accordance with this example implementation, the geospatial flow model can model the movement of refugees into, out of and through different locations within a crisis region based on various patterns in historical data. In various embodiments, method 800 can be performed by computing device 102 and/or one or more components of computing device 102 (e.g., the input reception component 106, the interface component 108, the input interpretation component 110, the modeling component 112, and/or the application component 114). Repetitive description of like elements employed in respective embodiments is omitted for sake of brevity.

At 802, the computing device 102 can receive (e.g., via input reception component 106) natural language input including a question proposing an event associated with the system. For example, in this example implementation, the natural language input include a plain text questions asking "What if the border between Greece and Macedonia is closed?" At 804, the computing device 102 can initially perform a first relationship extraction against the plain text to identify a subject and an action. For example, in accordance with the subject implementation, the input interpretation component can identify the subject as "border between Greece and Macedonia," and the action as "closed." First thing you do is entity and relationship extraction. This type of relationship extraction can be repeated by the input interpretation component 110 to get a more granular labeling of the entities/elements represented by the natural language input. For example, at 806, the subject can be broken down into more granular entities such as location type, origin country, destination country, etc. These different entities can be predefined and vary based on the type of system and associated flow model evaluated as well as the natural language input received. For example, there can many different ways a user might provide input that represent the same entity. For example, many terms can be mapped to a same entity term (e.g., Greek, Greece, or the republic of Greece or the Greeks, etc. can all be mapped to the same location, Greece).

In order to map all these different textual representations to the same entity and/or otherwise perform entity disambiguation, at 808 the input interpretation component 110 can compute word2vec representations of the natural language entities. This means that for each of the entities, (or in some embodiments, one or more), the input interpretation component 110 can compute a word2vec vector. Then at 810, the input interpretation component 110 can compare the computed word2vec representations to defined word2vec representations of known locations, locations types and actions. In particular, the input interpretation component 110 can access predefined information (e.g., provided in the data storage 120 as input to model parameter/constraint mapping information 124) that correlates known locations and actions for the system with word vectors. For example, in order to develop the defined known word2vec representations, a map can be developed that identifies all possible terms or key words that can be mapped to each (or in some embodiments, one or more), known entity (e.g., actions to known actions, countries to known countries, events to known events, etc.). In various implementations, the defined word2vec representations of the known locations and actions can be included in the input to model parameter/constraint mapping information 124.

At 812, based on the comparison of the computed word2vec representations with the defined word2vec representations of known locations, location types and actions, the input interpretation component 110 can generate a structured representation of the proposed event. For example, the structured representation can identify a specific location type identifier (ID), a specific origin country (ID), a specific destination country ID, and a specific action. The computing device 102 can be configured to take this structured representation and turn it into model constraints and/or values for the one or more parameters of the mathematical flow model for the system (e.g., using the input interpretation component 110). In particular, the computing device 102 can convert the structured representation of the natural language input into a (finite) list of parameter updates to the model. The modeling component 112 can then update the model based on the new model parameter values.

Figure 9:
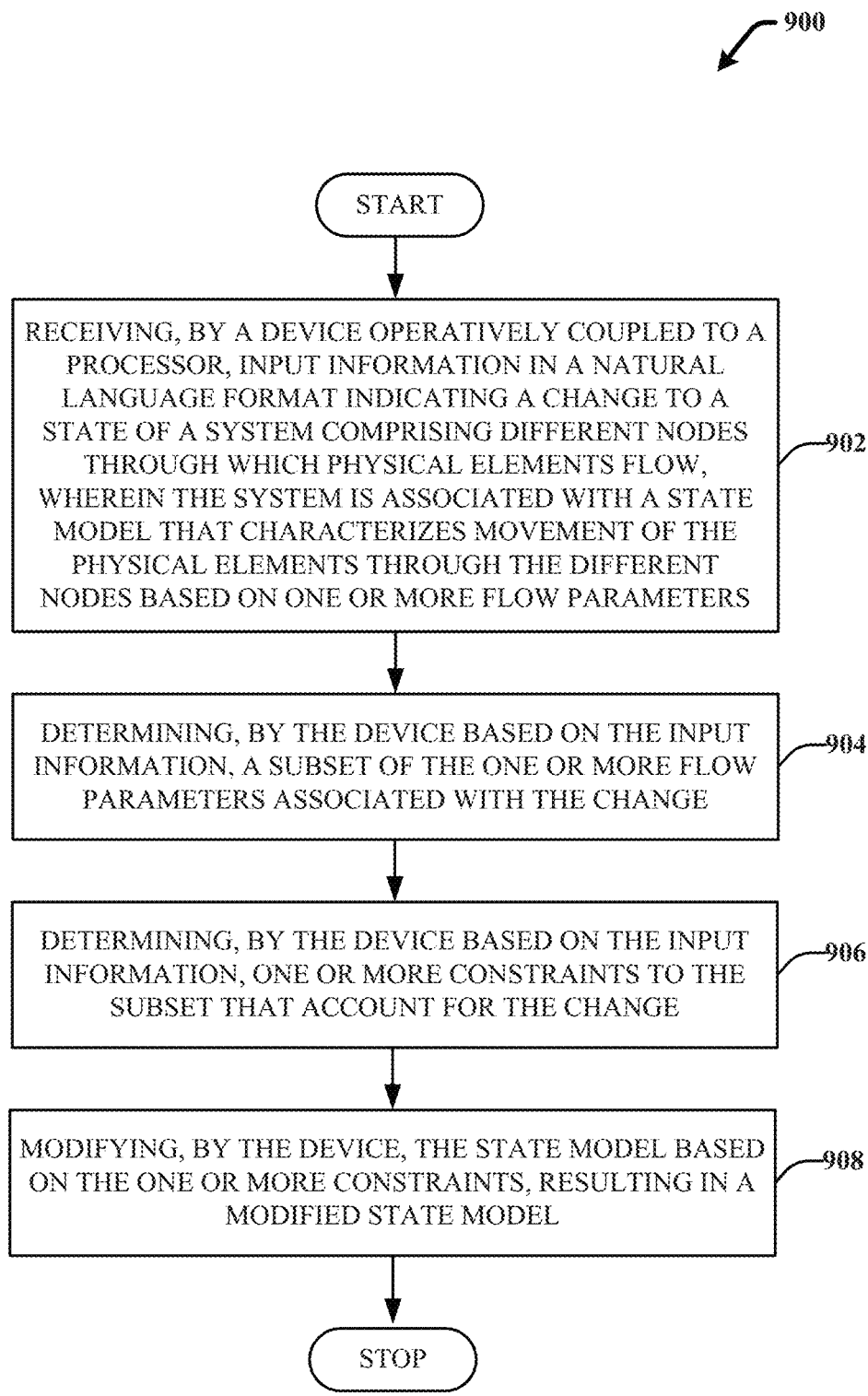
FIG. 9 provides a high level flow diagram of another example, non-limiting computer implemented method for employing NLP to facilitate geospatial analysis in accordance with one or more embodiments described herein.
Figure 10:
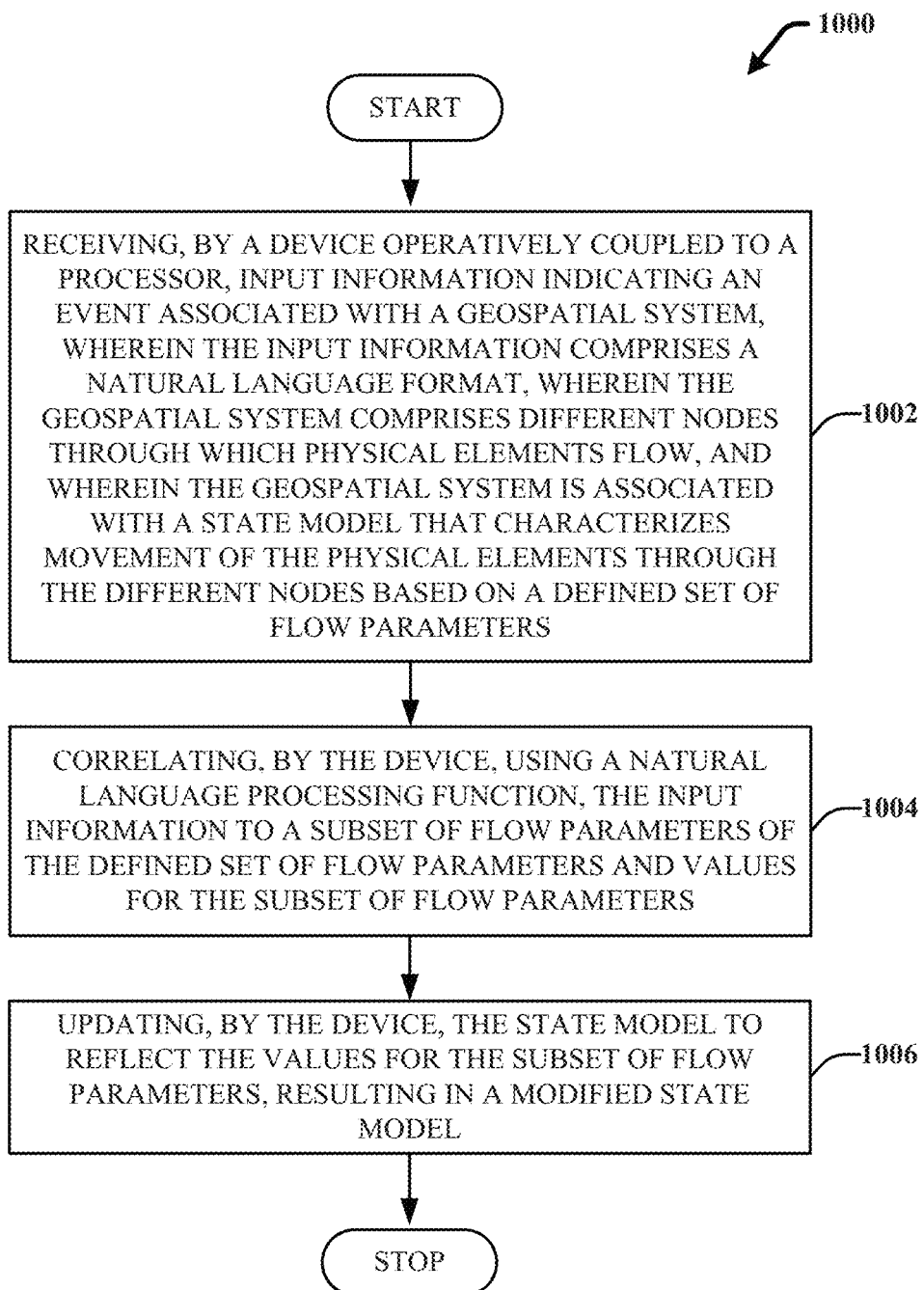
FIG. 10 provides a high level flow diagram of another example, non-limiting computer implemented method for employing NLP to facilitate geospatial analysis in accordance with one or more embodiments described herein.
Figure 11:
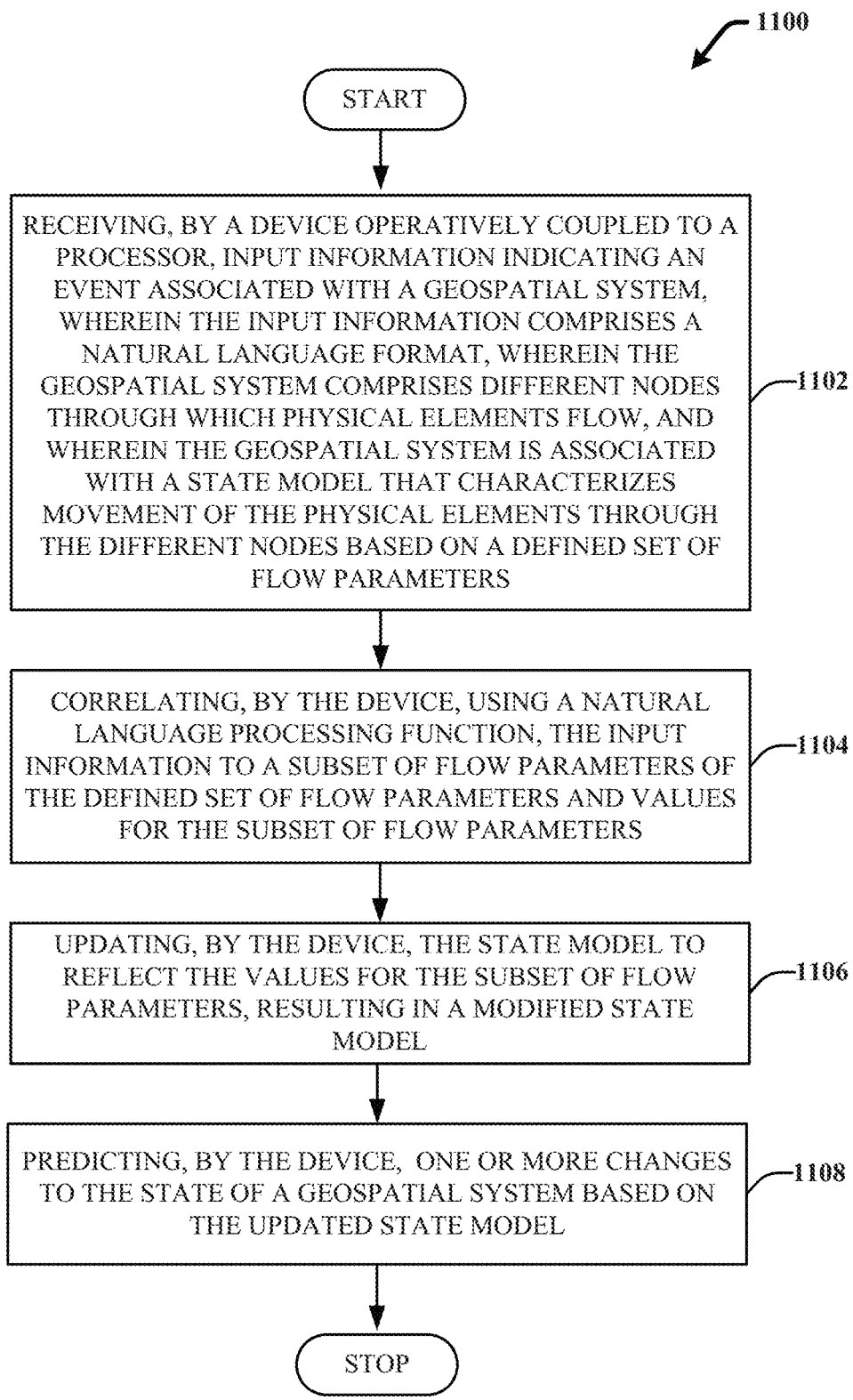
FIG. 11 provides a high level flow diagram of another example, non-limiting computer implemented method for employing NLP to facilitate geospatial analysis in accordance with one or more embodiments described herein.

FIGS. 9-11 illustrate various methodologies in accordance with the disclosed subject matter. While, for purposes of simplicity of explanation, the methodologies are shown and described as a series of acts, it is to be understood and appreciated that the disclosed subject matter is not limited by the order of acts, as some acts can occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts can be required to implement a methodology in accordance with the disclosed subject matter. Additionally, it should be further appreciated that the methodologies disclosed hereinafter and throughout this specification are capable of being stored on an article of manufacture to facilitate transporting and transferring such methodologies to computers.

FIG. 9 provides a high level flow diagram of another example, non-limiting computer implemented method 900 for employing NLP to facilitate geospatial analysis in accordance with one or more embodiments described herein. Repetitive description of like elements employed in respective embodiments is omitted for sake of brevity.

At 902, a device operatively coupled to a processor (e.g., computing device 102), receives input information in a natural language format indicating a change to a state of a system comprising different nodes through which physical elements flow, wherein the system is associated with a state model that characterizes movement of the physical elements through the different nodes based on one or more flow parameters (e.g., via input reception component 106). At 904 the device determines, based on the input information, a subset of the one or more flow parameters associated with the change (e.g., via the input interpretation component 110). At 906, the device determines, based on the input information, one or more constraints to the subset that account for the change. At 908, the device modifies the state model based on the one or more constraints, resulting in a modified state model (e.g., via the modeling component 112).

FIG. 10 provides a high level flow diagram of another example, non-limiting computer implemented method 1000 for employing NLP to facilitate geospatial analysis in accordance with one or more embodiments described herein. Repetitive description of like elements employed in respective embodiments is omitted for sake of brevity.

At 1002, a device operatively coupled to a processor (e.g., computing device 102), receive input information indicating an event associated with the geospatial system, wherein the input information comprises a natural language format, wherein the geospatial system comprises different nodes through which physical elements flow, and wherein the geospatial system is associated with a state model that characterizes movement of the physical elements through the different nodes based on a defined set of flow parameters (e.g., via input reception component 106). At 1002, the device correlates, using a NLP function, the input information to a subset of flow parameters of the defined set of flow parameters and values for the subset of flow parameters (e.g., via the input interpretation component 110). At 1006 the device updates the state model to reflect the values for the subset of flow parameters, resulting in a modified state model (e.g., via the modeling component 112).

FIG. 11 provides a high level flow diagram of another example, non-limiting computer implemented method for employing NLP to facilitate geospatial analysis in accordance with one or more embodiments described herein. Repetitive description of like elements employed in respective embodiments is omitted for sake of brevity.

At 1102, a device operatively coupled to a processor (e.g., computing device 102), receive input information indicating an event associated with the geospatial system, wherein the input information comprises a natural language format, wherein the geospatial system comprises different nodes through which physical elements flow, and wherein the geospatial system is associated with a state model that characterizes movement of the physical elements through the different nodes based on a defined set of flow parameters (e.g., via input reception component 106). At 1104, the device correlates, using a NLP function, the input information to a subset of flow parameters of the defined set of flow parameters and values for the subset of flow parameters (e.g., via the input interpretation component 110). At 1106 the device updates the state model to reflect the values for the subset of flow parameters, resulting in a modified state model (e.g., via the modeling component 112). At 1108, the device predicts one or more changes to the state of a geospatial system based on the updated state model (e.g., via application component 114).

Accordingly, using the subject predictive geospatial modeling techniques, a user can evaluate various potential events that may occur (or have been determined to occur in the future) with respect to a geospatial system (environment, scenario, etc.), to determine how these potential events will affect the system. The user and/or a computing system can further use this information to decide appropriate responses to take. For example, in furtherance to the refugee migration system, using the disclosed predictive geospatial modeling techniques, a governmental agency can propose possible events that may occur (or have been determined to occur in the future) to determine the outflow of refugees and migrants from particular countries, how many people will be in certain bases over the next few days, and the like. Based on this information, the agency can determine various operation and policy decisions, such as how much aid to dispatch to a refugee base, how much funding is needed, and the like.

With the subject predictive geospatial modeling techniques, a user can analyze the consequences of a set of assumptions about the state of a system with geospatial and temporal components without having any technical knowledge about predictive geospatial modeling. In particular, the disclosed techniques eliminates the need for the user who wants to make predictions based on their own assumptions to know the details of the underlying models used and the correspondence between the model parameters and real-world scenarios. In this regard, a user can propose an event or scenario in natural language and automatically receive a response that tells the user the effects on the system. The user does not have to have any understanding of the underlying mathematical model, the particular model parameters that are affected by the proposed event, the manner in which those particular parameters change based on the proposed event, or the manner in which those changes to those particular parameters might change other parameters of the model (e.g., in domino effect fashion). As a result, the disclosed predictive geospatial modeling techniques allow a non-technical user without expertise in geospatial analytics and mathematical modeling (e.g., policy makers), to evaluate geo-spatial problems (e.g., using a what-if type analysis), thereby substantially improving the speed and accuracy of their evaluation. Thus policy makers can better understand system dynamics without needing programming skills.

In this disclosure, the refugee migration system is used an example use-case in association with various embodiments of the disclosed predictive geospatial modeling techniques. However, it should be appreciated that the disclosed geospatial modeling techniques can be applied to several other fields or applications with geo-spatial components, including but not limited to: global logistics, aviation, power networks, water networks, transportation (of goods and people), and other public/municipal infrastructures.

The present invention can be a system, a method, and/or a computer program product at any possible technical detail level of integration. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each (or in some embodiments, one or more), computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each (or in some embodiments, one or more), block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession may, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In connection with FIG. 12, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which can be explicitly illustrated herein.

Figure 12:
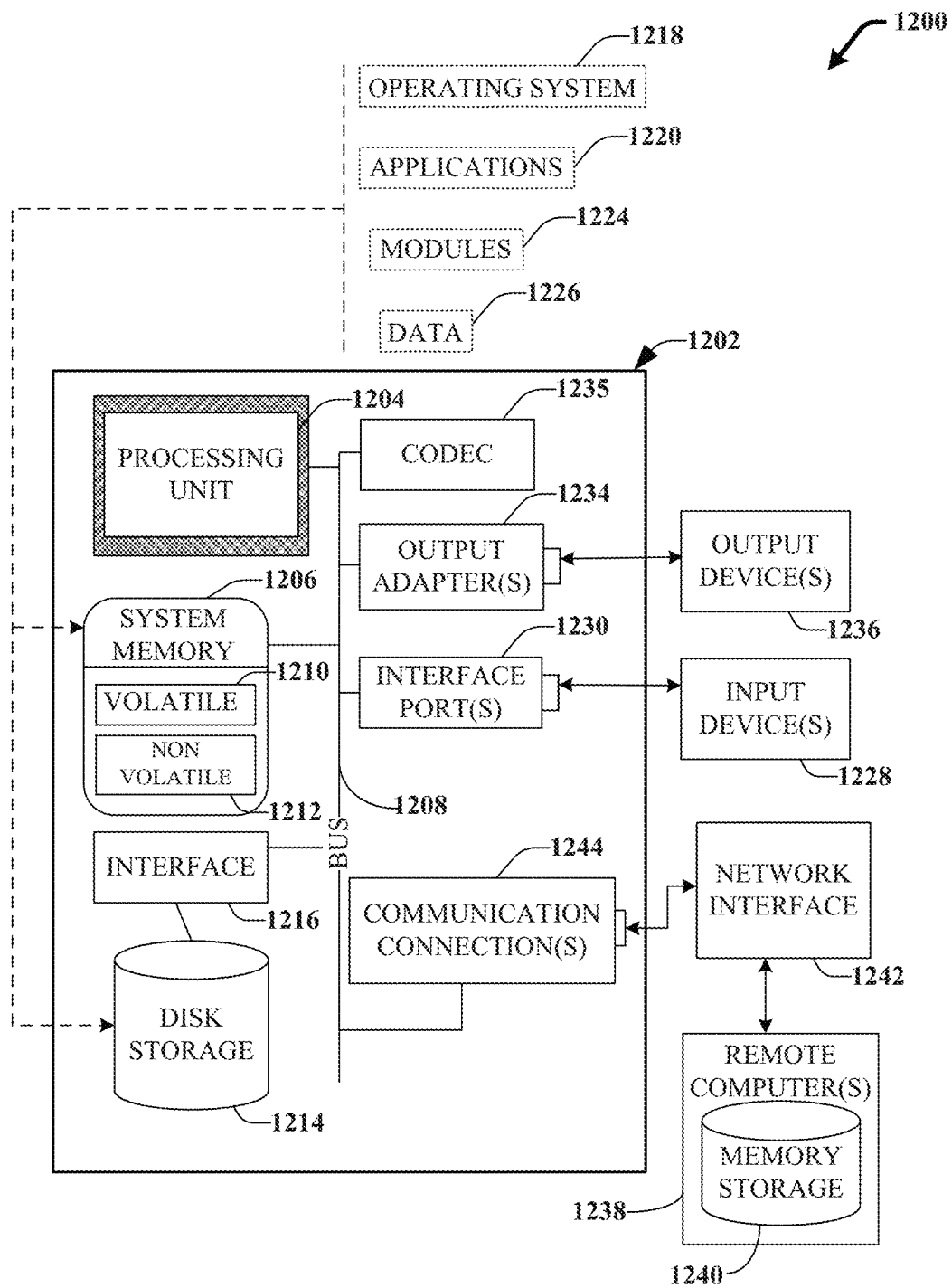
FIG. 12 illustrates a block diagram of an example, non-limiting operating environment in which one or more embodiments described herein can be facilitated.

With reference to FIG. 12, an example environment 1200 for implementing various aspects of the claimed subject matter includes a computer 1202. The computer 1202 includes a processing unit 1204, a system memory 1206, a codec 1235, and a system bus 1208. The system bus 1208 couples system components including, but not limited to, the system memory 1206 to the processing unit 1204. The processing unit 1204 can be any of various available processors. Dual microprocessors and other multiprocessor architectures also can be employed as the processing unit 1204.

The system bus 1208 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 13124), and Small Computer Systems Interface (SCSI).

The system memory 1206 includes volatile memory 1210 and non-volatile memory 1212, which can employ one or more of the disclosed memory architectures, in various embodiments. The basic input/output system (BIOS), containing the basic routines to transfer information between elements within the computer 1202, such as during start-up, is stored in non-volatile memory 1212. In addition, according to present innovations, codec 1235 can include at least one of an encoder or decoder, wherein the at least one of an encoder or decoder can consist of hardware, software, or a combination of hardware and software. Although, codec 1235 is depicted as a separate component, codec 1235 can be contained within non-volatile memory 1212. By way of illustration, and not limitation, non-volatile memory 1212 can include read only memory (ROM), programmable ROM (PROM), electrically programmable ROM (EPROM), electrically erasable programmable ROM (EEPROM), Flash memory, 3D Flash memory, or resistive memory such as resistive random access memory (RRAM). Non-volatile memory 1212 can employ one or more of the disclosed memory devices, in at least some embodiments. Moreover, non-volatile memory 1212 can be computer memory (e.g., physically integrated with computer 1202 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1210 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 1202 can also include removable/non-removable, volatile/non-volatile computer storage medium. FIG. 12 illustrates, for example, disk storage 1214. Disk storage 1214 includes, but is not limited to, devices like a magnetic disk drive, solid state disk (SSD), flash memory card, or memory stick. In addition, disk storage 1214 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1214 to the system bus 1208, a removable or non-removable interface is typically used, such as interface 1216. It is appreciated that disk storage 1214 can store information related to a user. Such information might be stored at or provided to a server or to an application running on a user device. In one embodiment, the user can be notified (e.g., by way of output device(s) 1236) of the types of information that are stored to disk storage 1214 or transmitted to the server or application. The user can be provided the opportunity to opt-in or opt-out of having such information collected or shared with the server or application (e.g., by way of input from input device(s) 1228).

It is to be appreciated that FIG. 12 describes software that acts as an intermediary between users and the basic computer resources described in the suitable operating environment 1200. Such software includes an operating system 1218. Operating system 1218, which can be stored on disk storage 1214, acts to control and allocate resources of the computer system 1202. Applications 1220 take advantage of the management of resources by operating system 1218 through program modules 1224, and program data 1226, such as the boot/shutdown transaction table and the like, stored either in system memory 1206 or on disk storage 1214. It is to be appreciated that the claimed subject matter can be implemented with various operating systems or combinations of operating systems.

A user enters commands or information into the computer 1202 through input device(s) 1228. Input devices 1228 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1204 through the system bus 1208 via interface port(s) 1230. Interface port(s) 1230 include, for example, a serial port, a parallel port, a game port, and a universal serial bus (USB). Output device(s) 1236 use some of the same type of ports as input device(s) 1228. Thus, for example, a USB port can be used to provide input to computer 1202 and to output information from computer 1202 to an output device 1236. Output adapter 1234 is provided to illustrate that there are some output devices 1236 like monitors, speakers, and printers, among other output devices 1236, which require special adapters. The output adapters 1234 include, by way of illustration and not limitation, video and sound cards that provide a means of connection between the output device 1236 and the system bus 1208. It should be noted that other devices or systems of devices provide both input and output capabilities such as remote computer(s) 1238.

Computer 1202 can operate in a networked environment using logical connections to one or more remote computers, such as remote computer(s) 1238. The remote computer(s) 1238 can be a personal computer, a server, a router, a network PC, a workstation, a microprocessor based appliance, a peer device, a smart phone, a tablet, or other network node, and typically includes many of the elements described relative to computer 1202. For purposes of brevity, only a memory storage device 1240 is illustrated with remote computer(s) 1238. Remote computer(s) 1238 is logically connected to computer 1202 through a network interface 1242 and then connected via communication connection(s) 1244. Network interface 1242 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1244 refers to the hardware/software employed to connect the network interface 1242 to the bus 1208. While communication connection 1244 is shown for illustrative clarity inside computer 1202, it can also be external to computer 1202. The hardware/software necessary for connection to the network interface 1242 includes, for exemplary purposes only, internal and external technologies such as, modems including regular telephone grade modems, cable modems and DSL modems, ISDN adapters, and wired and wireless Ethernet cards, hubs, and routers.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration and are intended to be non-limiting. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer implemented method, comprising:
receiving, by a device operatively coupled to a processor, input information in a natural language format indicating a change to a state of a geospatial system comprising different nodes through which physical elements flow, wherein the geospatial system is associated with a state model that characterizes movement of the physical elements through the different nodes based on one or more flow parameters;
computing, by the device, respective word2vec vectors for the input information received in the natural language format;
comparing, by the device, the computed word2vec vectors to defined word2vec vectors of known locations and actions associated with one or more potential events based on the one or more model parameters and constraints that correlate to the known locations and the actions; and
based on the comparison, generating, by the device, a structured representation employed to update the state model;
determining, by the device based on the input information, a subset of the one or more flow parameters associated with the change;
determining, by the device based on the input information, one or more constraints to the subset that account for the change;
modifying, by the device, the state model based on the one or more constraints, resulting in a modified state model; and
applying, by the device, the modified state model to determine output information regarding a predicted effect on the movement of the physical elements through the different nodes as a result of the change to the state of the geospatial system.

2. The computer implemented method of claim 1, wherein the determining the subset of the one or more flow parameters and the determining the one or more constraints comprises employing a natural language processing function.

3. The computer implemented method of claim 2, wherein the employing the natural language processing function comprises identifying one or more defined terms in the input information that have been mapped to the one or more flow parameters and the one or more constraints.

4. The computer implemented method of claim 3, wherein the one or more defined terms comprise one or more locations corresponding to one or more nodes of the different nodes, and one or more operations corresponding to at least one of the one or more flow parameters.

5. The computer implemented method of claim 1, wherein the natural language is input via a user speaker.

6. The computer implemented method of claim 1, wherein the receiving comprises receiving via voice recognition.

7. The computer implemented method of claim 1, wherein the input information comprises a question about the change to the state of the geospatial system received as unstructured plain text data.

8. The computer implemented method of claim 7, wherein an input interpretation component converts the unstructured plain text data to structured machine-readable data and further determines the subset and the one or more constraints based on the structured machine-readable data.

9. A computer implemented method, comprising:
receiving, by a device operatively coupled to a processor, input information in a natural language format indicating a change to a state of a geospatial system, wherein the geospatial system is represented by a state model that characterizes movement of the physical elements through the different nodes based on one or more flow parameters;
computing, by the device, respective word2vec vectors for the input information received in the natural language format;
comparing, by the device, the computed word2vec vectors to defined word2vec vectors of known locations and actions associated with one or more potential events based on the one or more model parameters and constraints that correlate to the known locations and the actions; and
based on the comparison, generating, by the device, a structured representation employed to update the state model;
converting, by the device, the natural language format into a machine-readable format that defines an event associated with the change to the state, wherein the machine-readable format is a computer programming language readable by a computer;
correlating, by the device, the machine-readable format of the natural language input to one or more defined model parameters and constraints for one or more defined model parameters;
updating, by the device, a mathematical flow model based on the one or more defined model parameters and the constraints to indicate the event;
generating, by the device, output information describing a predicted effect on the geospatial system based on application of the updated mathematical flow model to historical data; and
outputting, by the device, the output information, wherein the outputting comprising rendering the output information via a display of a graphical user interface of the device or another device.

* * * * *